United States Patent [19]

Kim

[11] Patent Number: 4,504,552
[45] Date of Patent: Mar. 12, 1985

[54] INTEGRATED RESISTOR OF NIOBIUM OXIDE PASSIVATING RING, GOLD CORROSION BARRIER, AND TITANIUM RESISTIVE LAYER

[75] Inventor: Kwang K. Kim, Poughkeepsie, N.Y.

[73] Assignee: International Business Machines Corporation, Armonk, N.Y.

[21] Appl. No.: 590,319

[22] Filed: Mar. 16, 1984

Related U.S. Application Data

[62] Division of Ser. No. 454,911, Dec. 30, 1982, Pat. No. 4,459,321.

[51] Int. Cl.$^3$ .......................... H01L 3/00; H01L 5/00
[52] U.S. Cl. ......................................... 428/620; 357/5; 428/662; 428/672; 428/660
[58] Field of Search ..................... 428/620, 662, 672

[56] References Cited

U.S. PATENT DOCUMENTS

| | | | |
|---|---|---|---|
| 3,386,906 | 6/1968 | Bronnes | 428/620 |
| 3,701,931 | 10/1972 | Revitz et al. | 428/620 |
| 3,754,168 | 8/1973 | Cunningham | 428/620 |
| 3,877,063 | 4/1975 | Kakihana | 357/71 |
| 3,907,620 | 9/1975 | Abraham et al. | 156/11 |
| 3,913,120 | 10/1975 | Lahiri | 357/5 |
| 4,083,029 | 4/1978 | Lahiri | 338/325 |
| 4,310,569 | 1/1982 | Harrington | 427/89 |
| 4,316,200 | 2/1982 | Ames et al. | 357/5 |
| 4,376,336 | 3/1983 | Endo et al. | 29/571 |

FOREIGN PATENT DOCUMENTS

| | | |
|---|---|---|
| 8210197 | 3/1982 | European Pat. Off. . |
| 587567 | 5/1977 | Switzerland . |
| 1492580 | 11/1977 | United Kingdom . |

OTHER PUBLICATIONS

IBM Technical Disclosure Bulletin, vol. 18, No. 8, Jan. 1976, p. 2646, "Making Josephson Junctions in One Vacuum Step", by Forster et al.

Primary Examiner—Veronica O'Keefe
Attorney, Agent, or Firm—Carl C. Kling

[57] ABSTRACT

A minimal corrosion resistor structure and deposition technique for superconductive circuits, with mutually protective niobium oxide passivation ring, gold corrosion barrier film and titanium resistive layer. Niobium has an intrinsic oxide of $Nb_2O_5$, which must be removed from a contact area designated by an opening in photoresist; the development process leaves a photoresist overhang. The corrosion barrier film is deposited through the opening. The resistive metal layer is deposited over the corrosion barrier film through the same opening. The gold corrosion barrier film prevents the titanium resistive metal layer from making corrosive contact with the niobium. The titanium resistive metal layer encapsulates the gold corrosion barrier film to prevent diffusion between the gold and further layers to be deposited subsequently. It would normally be possible for the titanium to spill over the gold and make corrosive intimate contact with the niobium; a self-alignment technique prevents such contact. The gold corrosion barrier film is sharply focused to form an area corresponding to the opening in the photoresist. An unfocused plasma oxidation step, which follows the gold deposition, grows an extrinsic $Nb_2O_5$ passivation ring about the gold. The titanium resistive metal is then deposited with a wider focus than that of the gold corrosion barrier film, through the same opening; the titanium resistive metal layer deposits over the edge of the gold, encapsulating the gold with a diffusion barrier.

6 Claims, 12 Drawing Figures

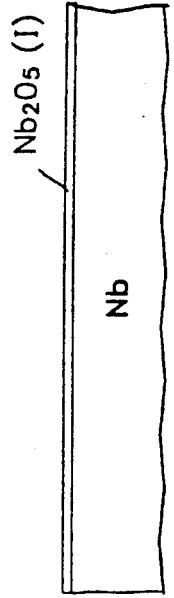
FIG. 1.1
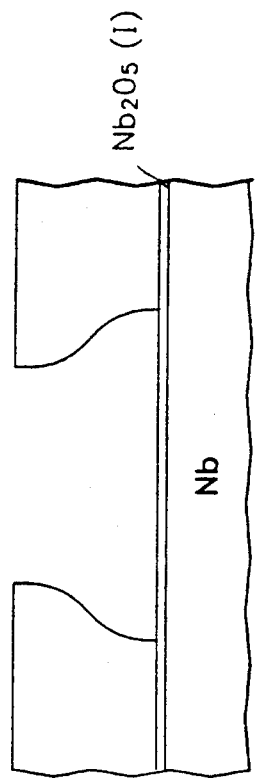
FIG. 1.2
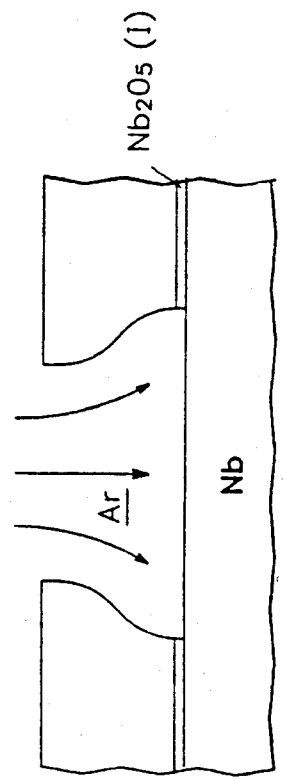
FIG. 1.3

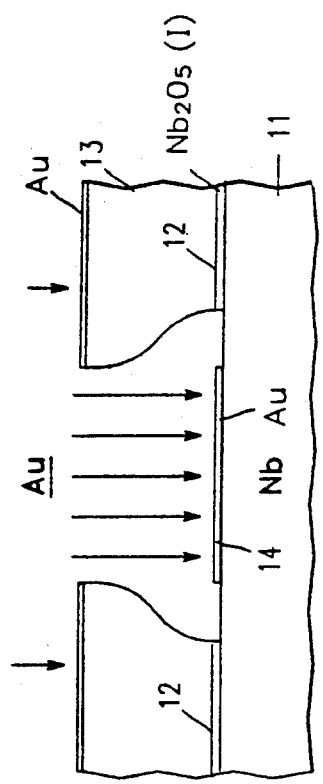
FIG. 1.4
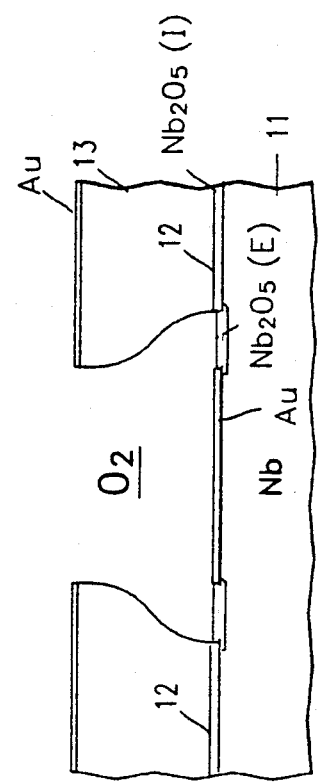
FIG. 1.5
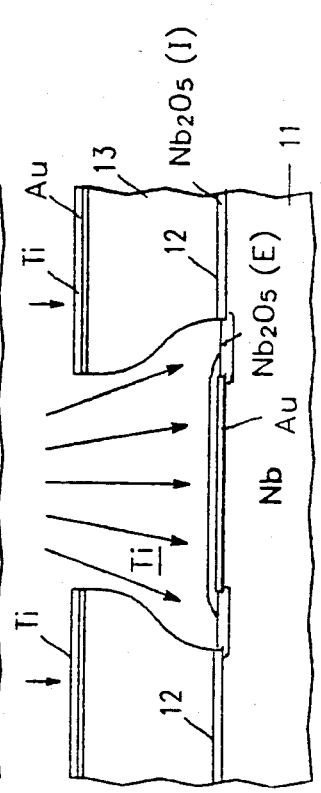
FIG. 1.6

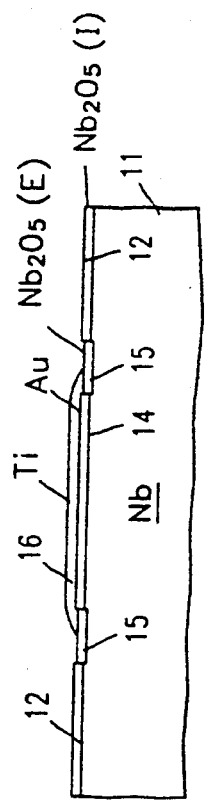
FIG. 1.7
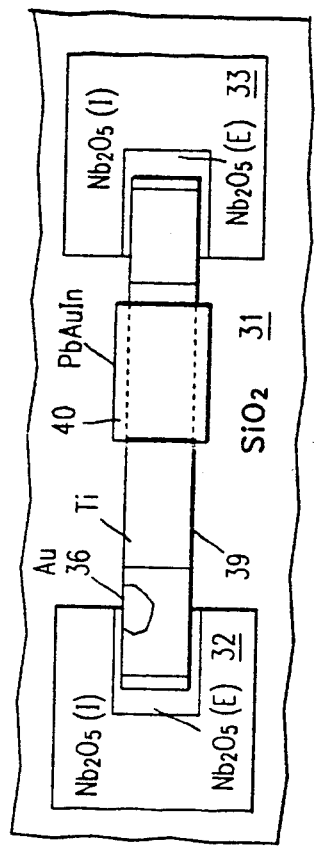
FIG. 3
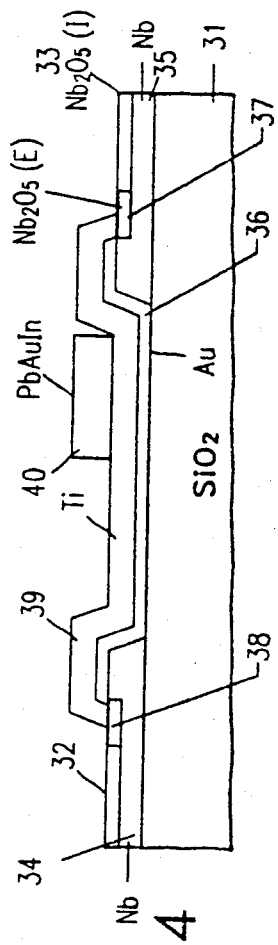
FIG. 4

INTEGRATED RESISTOR OF NIOBIUM OXIDE PASSIVATING RING, GOLD CORROSION BARRIER, AND TITANIUM RESISTIVE LAYER

This is a division, of application Ser. No. 454,911 filed 12/30/82, now U.S. Pat. No. 4,459,321.

BACKGROUND OF THE INVENTION

1. Field of the Invention

This invention relates to the field of integrated circuits and, more specifically, to a minimal corrosion resistor metallurgy and multi-focus deposition technique for applying closely overlapped mutually protective barrier films and resistive metal films to provide integrated resistors without incurring corrosion or interdiffusion failures.

2. Description of the Prior Art

Simple metal resistors of a metal such as titanium have many desirable features such as mechanical strength, thermal stability and easy control of resistance values, but are susceptible to corrosion when in contact with niobium films.

It is known in the field of integrated circuit fabrication that gold has desirable anti-corrosive barrier properties and that gold is a good conductor suitable for use as a metallization region. Certain gold alloys and gold layers have been used and suggested in a number of anti-corrosive contact characterizations. Gold, however, is not a good diffusion barrier.

It is known in the field of integrated circuit fabrication, particularly for cryogenic devices such as Josephson devices, that niobium is a useful superconductor, susceptible to passivation by oxidation, which is capable both in metallic form and oxide form of withstanding temperature cycling between room temperature $\sim 20°$ K. and liquid helium temperature $\sim 4.2°$ K.

Niobium is known to grow an intrinsic oxide, a surface layer of $Nb_2O_5$ which forms naturally at ambient temperatures in ambient atmospheres containing oxygen.

For example, U.S. Pat. No. 4,310,569, Harrington, "Method of Adhesion of Passivation Layer to Gold Metallization Regions in a Semiconductor Device," Jan. 12, 1982, shows a gold-reactive metal interface, which interface provides improved adhesion for a subsequent passivation layer. Harrington does not, however, show any technique for passivating a ring around a barrier film to prevent corrosive intimate contact between incompatible materials.

U.S. Pat. No. 4,316,200, Ames et al, "Contact Technique for Electrical Circuitry," Feb. 16, 1982, shows the use of $Nb_2O_5$ on the top and sides of a niobium metal layer to act as an electrical insulator, in the context of a cryogenic temperature integrated circuit. Ames et al does not, however, show any technique for passivating a ring around a barrier film to prevent corrosive intimate contact between incompatible materials.

U.S. Pat. No. 3,907,620, Abraham et al, "A Process of Forming Metallization Structures on Semiconductor Devices," shows a process for forming tantalum nitride layers on a semiconductor. Abraham et al does not, however, show any technique for passivating a ring around a barrier film to prevent corrosive intimate contact between incompatible materials. European patent 82101971.8, Gasser et al, shows a gold oxidation prevention film between the Josephson tunnel barrier ($Nb_2O_5$) layer and an overlying niobium layer.

None of the prior art nor any combination of prior art teaches the close tolerance mutually protective corrosion barrier film/passivating ring/diffusion barrier resistive layer described in this patent specification, nor does the prior art in any way teach the method of using focus variations within an overhanging photoresist opening to provide close tolerance mutually protective corrosion barrier film/passivating ring/diffusion barrier resistive layer structure.

SUMMARY OF THE INVENTION

The invention is a minimal corrosion resistor metallurgy and deposition technique especially well suited to very low temperatures associated with superconductors. The invention operates by extrinsic metal oxide passivating the oxidizable conductive metal perimeter ring around a barrier film contact area, by a plasma oxidation, permitting a subsequent resistive metal layer to make good resistive metal/corrosion barrier film/conductive metal contact without the corrosion susceptibility of resistive metal/conductive metal intimate contact.

Oxidizable conductive metal used as a base electrode must have contact areas cleaned of the intrinsic oxide layer for contacting integrated resistive metal resistors. These areas are defined by openings in photoresist; the photoresist development process leaves a photoresist overhang. The actual area of exposed oxidizable conductive metal after cleaning is greater by the amount of the overhang than is the opening in the surface of the photoresist.

A thin corrosion barrier metal film is deposited, through the opening in the photoresist, onto the cleaned oxidizable conductive metal. The resistive metal is deposited over the corrosion barrier film. The corrosion barrier film lies between the resistive metal layer and the conductive (includes superconductive) metal layer to prevent the resistive metal from making intimate contact with the conductive metal. The contact area is coated with the corrosion barrier film layer only in the central area of the oxide-free cleaned area of the oxidizable conductive metal layer, as defined by the opening in the surface of the photoresist; the resistive metal layer is deposited over the corrosion barrier film, defined by the same opening in the surface of the photoresist. It would be possible in such a situation, however, for the resistive metal to spill over the edge of the corrosion barrier film, providing intimate contact where corrosion starts. To prevent such corrosion due to resistive metal spillover around the corrosion barrier film edges, an unfocused plasma oxidation step is introduced after the corrosion barrier film deposition but before the resistive metal deposition. This plasma oxidation step causes oxidation of the bare oxidizable conductive metal ring exposed underneath the photoresist overhang, forming an oxide passivating ring around the corrosion barrier contact area. This passivating ring eliminates the possibility of any intimate contact between oxidizable conductive metal and the resistive metal. The corrosion barrier film does not oxidize readily; this oxidation step converts the exposed oxidizable conductive metal to its passivating oxide without harming the surface of the corrosion barrier film, which remains conductive and receptive to further deposition of resistive metal.

Since the cleaned area, the corrosion barrier film and the resistive film require specific overlap relationships, these overlaps require careful dimensional and locational control. This control is achieved by using the opening in the surface of the photoresist as a lens opening for two differently focused depositions so that the barrier film is completely overlapped by the resistive metal layer. The resistive metal layer is deposited from a melt larger than the melt used to deposit the corrosion barrier metal, which focuses the resistive metal deposition over a greater area to cover the edges of the corrosion barrier metal—and thus to form a resistive metal diffusion barrier over the entire corrosion barrier metal film, making possible further metallizations, such as contact by low temperature solder, without danger of destructive diffusion. The corrosion barrier metal film protects the resistive metal from destruction by corrosion; the resistive metal layer protects the corrosion barrier metal from destruction by diffusion. The passivating ring seals the edges.

The same oxidation step which passivates the ring about the corrosion barrier layer also passivates any pinhole defects which might exist in the corrosion barrier film. Note that it is not possible to avoid pinholes by increasing the thickness of the corrosion barrier film because of the decreased resistivity inherent in such films, which is in parallel to the resistor overlaid on it.

A preferred resistive metal is titanium; a preferred corrosion barrier metal is gold; a preferred conductive metal (superconductive metal) is niobium.

The gold/titanium resistor is made compatible with lead-gold-indium alloys by making use of a titanium melt larger in size than the gold melt. The titanium atoms from the larger area melt are not so sharply focused and deposit farther under the photoresist overhang than do the more sharply focused gold atoms, the titanium metal thus overlapping the edge of the gold film onto the niobium oxide passivating ring. This overlap eliminates any possibility of intimate contact between the gold underneath the titanium and the lead-gold-indium metallurgy added above the titanium. Such lead-gold-indium metallurgy is useful in trimming resistors by providing appropriate superconductive shunts over selected portions along the length of the respective resistors.

The object of the invention is to provide a self-aligned resistive contact structure for cryogenic temperature applications, which resistive contact structure is minimally subject to destruction by corrosion and to destruction by diffusion.

Another object of the invention is to provide a resistor contact structure for cryogenic applications, which resistor structure is capable of withstanding the stresses of repeated heat cycling from room temperature to cryogenic temperatures, is easily fabricated, and does not suffer early life failures due to corrosive contact between electrochemically non-compatible materials nor to early life failures due to diffusion of unwanted atoms from adjacent layers in composite structures.

Another object of the invention is to provide, in a contact structure of a plurality of layers of corrosively contrasting materials, a passivation ring encircled barrier contact which permit conduction without permitting corrosive contact of incompatible layers.

Another object of the invention is to provide a corrosion resistant contact structure in which a corrosion barrier film forms a contact area on a conductive metal layer, a passivating ring is grown about the corrosion barrier film to permit a subsequent resistive film from making corrosive contact to the conductive metal layer, and the resistive film is dimensioned and placed so as to protect the corrosion barrier film from diffusion from subsequent additional depositions.

Another object is to provide a superconductive integrated circuit technology with a trimmable resistor structure.

Another object of the invention is to provide a multi-focus technique for successive depositions of mutually protective metals and passivation layers, taking advantage of overhang of the surface opening in a photoresist and differently focused successive depositions so as to ensure very close overlaps of the successively deposited materials.

DESCRIPTION OF THE DRAWINGS

FIG. 1.1–1.7 is a not-to-scale composite process diagram showing process steps followed in practicing the invention.

FIG. 3 is a plan view of a resistor according to the invention, for incorporation into an integrated circuit.

FIG. 4 is an elevation view of the resistor of FIG. 3.

DESCRIPTION OF THE PREFERRED EMBODIMENT

Figure 2:
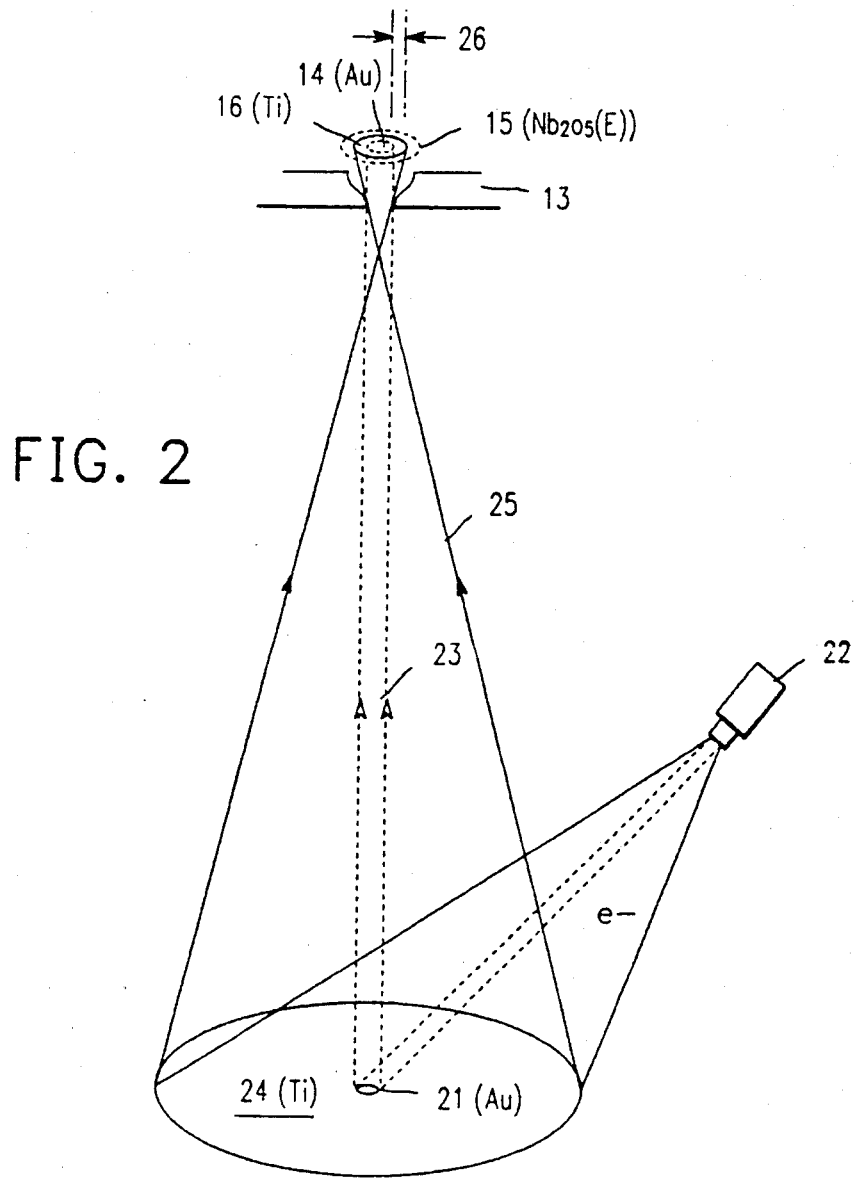
FIG. 2 is a not-to-scale operational diagram useful in explaining the critical relationships of successive layers defined by the same opening in a photoresist.

The end result of the technique of the preferred embodiment is a resistor contacting two niobium metal areas of a printed circuit. The niobium metal areas may be, for example, areas of base electrode in a Josephson junction technology integrated circuit. The resistor may be trimmed from high to low by an applied shunt of superconductive solder.

FIG. 1 illustrates in FIGS. 1.1–1.7 the major steps required to carry out the invention.

FIG. 1.1 shows a niobium metal layer 11 with its surface covered by intrinsic niobium oxide layer 12. The intrinsic niobium oxide layer is $Nb_2O_5$ and grows normally at room temperature in air. The intrinsic niobium oxide layer passivates the niobium metal layer and may, in many situations, be considered advantageous. The intrinsic niobium oxide layer has relatively higher resistance than niobium metal and also has different adhesion characteristics. The intrinsic niobium oxide must be removed in certain contact areas prior to deposition of subsequent layers.

FIG. 1.2 shows the addition of a photoresist layer 13 on the niobium surface; niobium layer 13 has a window opened into it to define the contact area. Note that the photoresist development process causes removal of a greater volume of photoresist at depth than at the surface of the photoresist, leaving an overhang. The overhang provides a window opening in the photoresist which is smaller than the area of the niobium/niobium oxide which is made accessible by the window.

FIG. 1.3 illustrates an argon sputter cleaning step to remove the accessible portion of the intrinsic niobium oxide 12.

FIG. 1.4 illustrates the deposition of gold corrosion barrier film 14 on the exposed surface of niobium metal 11 in the area defined by the overhang in the window of photoresist 13. Additional gold, of course, is deposited on top of the remaining surface of photoresist 13; this gold will be later removed by lift-off techniques.

FIG. 1.5 illustrates the radio frequency (RF) plasma oxidation step by which a ring 15 of extrinsic niobium oxide is grown about gold corrosion barrier film 14 in the areas under the overhang of photoresist 13 and outside the coverage of gold corrosion barrier film 14. This RF plasma oxidation step also seals in the same fashion any pinholes which might exist in gold corrosion barrier film 14. Note that gold corrosion barrier film 14 must be kept very thin (on the order of 20–200 Å) so as not to provide too low shunt resistance to the desired titanium resistor.

The process parameters in the preferred embodiment are as follows:
1. Flush sample chamber at room temperature with 99.999% pure argon 15–20 min. (FIG. 1.3)
2. Sputter clean in argon at 3 microbar partial pressure 10 min. at radio frequency excitation 800V (peak to peak) with a flow rate of 3.5 standard cubic centimeters per minute. (FIG. 1.3)
3. Flush sample chamber at room temperature with pure $O_2$ (99.999% pure) 10–20 min. (FIG. 1.5)
4. RF plasma oxidation for 3 min. at 360V (peak to peak) and 10 microbar of $O_2$ (99.999%) pure with a flow rate of 33 standard cubic centimeters per minute (SCCM). (Thermal oxidation is an alternative.) (FIG. 1.5)

FIG. 1.6 illustrates the titanium deposition step in which a titanium resistor layer 16 is deposited totally over gold corrosion barrier film 14 with the outside edges of the titanium resistance metal film 16 extending onto the extrinsic $Nb_2O_5$ passivating ring 15.

Note that the titanium resistive metal layer deposition stream in FIG. 1.6 is less focused than the gold corrosion barrier film deposition of FIG. 1.4, even though the titanium metallization is defined by the same window opening in photoresist layer 13 as the gold layer. The additional spread of the titanium into the undercut areas is sufficient to provide coverage of the edge of the gold corrosion barrier layer. This is important in that the titanium resistive metal layer does double duty as an anti-diffusion barrier layer protecting subsequent metallizations from diffusion from the gold in the gold corrosion barrier film.

A titanium film is also deposited on top of the gold film on top of the remaining photoresist 13; this titanium will be removed with the gold and photoresist layer 13 by lift-off techniques.

FIG. 1.7 illustrates the completed contact area of the resistor after removal of the photoresist and lift-off of the unwanted titanium and gold. Note that niobium metal 11 is completely covered by a surface of niobium oxide except in the area covered by the gold corrosion barrier film 14. There is no path available for a titanium resistive metal film 16 to make intimate contact to niobium metal 11 because of the continuous niobium oxide. Extrinsic niobium oxide passivating ring 15 and intrinsic niobium oxide film 11 are chemically and physically indistinguishable and provide passivation for all exposed areas of niobium. All the dimensions of the contact area shown in FIG. 1.7 may be very, very small. For example, the overlap of titanium resistive metal film 16 over gold corrosion barrier film 14 onto passivating ring 15 of extrinsic niobium oxide may be on the order of 200 Å and the entire contact area may be measurable in the thousands of Å.

FIG. 2 shows how these small dimensional relationships are provided in the preferred embodiment. FIG. 2 is provided for understanding only and is not to scale.

At the required times, FIG. 2 assumes that a crucible of gold or a crucible of titanium is made available within a suitable vacuum chamber for carrying out the process. The size of the gold crucible, and of the subsequently available titanium crucible, may be arbitrarily selected so long as a relatively small amount of gold surface or titanium surface is made available in line with the integrated circuit to be metallized. A spot 21 of gold is melted by an e-beam from e-beam generator 22 which is focused for a small spot. In the preferred embodiment the small spot is ½ centimeter, at a distance of 100 centimeters from the integrated circuit. The small gold melt provides an essentially unidirectional flow of gold metallization along path 23 through the window in photoresist 13 to provide gold corrosion barrier film 14 in an area defined by the opening in the surface of photoresist 13.

Subsequently, the titanium metallization is carried out with a titanium crucible in essentially the same position but with e-beam generator 22 focused to a much larger melt (24) of titanium. In the preferred embodiment the titanium melt is 2 centimeters in melt radius; the titanium melt is exaggerated in FIG. 2 to provide clarity in showing the relationship. Titanium metallization from this much larger melt source is focused much less sharply than was gold corrosion barrier film 14.

Problems of diffusion caused by intimate contact may be expected if there is to be a subsequent lead-gold-indium deposition, if such lead-gold-indium deposition should make intimate contact with gold contact area 14. Any such intimate contact is made impossible, the titanium resistive layer 15 being slightly larger than the underlying gold corrosion barrier contact layer in all area dimensions. The titanium resistive metal layer, which in such situations extends over the entire gold corrosion barrier film 14 onto $Nb_2O_5$ passivating ring 16, provides a substrate for any subsequent lead-gold-indium metallurgy; this substrate provides no access to the completely encapsulated gold 14. The resistive metal layer forms a diffusion barrier over the gold corrosion barrier film for mutual protection.

Thickness ranges for the metal depositions and oxide growth are shown in the following table:

| Gold | 20Å–200Å | corrosion barrier |
|---|---|---|
| Titanium | 200Å–2000Å | resistive metal |
| $Nb_2O_5$ | 10Å–200Å | passivation |

Corrosion resistance is not affected by thickness after minimums.

Optimum thicknesses of gold and titanium in the preferred embodiment are:
[For 2 Ω/□] 140 Å Au—750 Å Titanium
[ at 4.2° K.] Est. 60 Å $Nb_2O_5$.

Other corrosion barrier metals, which may be used instead of gold, are:
Palladium
Platinum Other resistive metals, which may be used instead of titanium, are:
Molybdenum
Hafnium
Zirconium
Vanadium
Tantalum
Tungsten
Ruthenium FIG. 3 is a plan view of an elongated resistor utilizing the technology described in FIG. 1.

FIG. 4 is a side-elevation view of the resistor structure 3.

Figure 5:
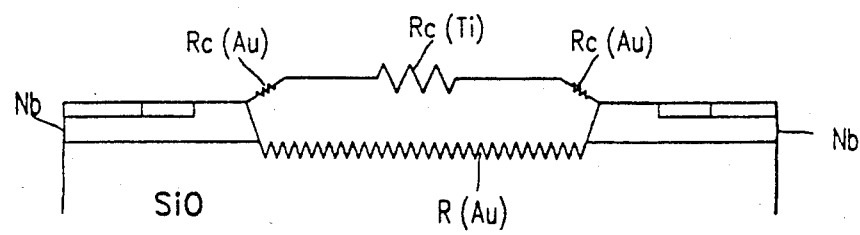
FIG. 5 is a schematic equivalent of FIG. 4.

FIG. 5 is a semi-schematic presentation of the same resistor. The entire resistor structure is arrayed on a silicon dioxide substrate 31. Two areas of Nb/Nb$_2$O$_5$ (I) appear in FIG. 3 as Nb$_2$O$_5$ (I) areas 32 and 33.

FIG. 4 shows niobium layers 34 and 35 under their respective intrinsic oxides 32 and 33. Gold corrosion barrier film 36 extends from niobium area 34 to niobium area 35 across a bare spot on the surface of silicon dioxide substrate 31. The passivating rings 37–38 of Nb$_2$O$_5$ (E), together with gold corrosion barrier film 36, seals the surfaces of niobium layers 34 and 35 at points which are unprotected by intrinsic oxide layers 32 and 33 or by gold corrosion barrier film 36.

Titanium resistive layer 39 bridges resistively between niobium area 34 and niobium area 35 and, in addition, provides a diffusion barrier extending over the unprotected surface of gold corrosion barrier film 36. Titanium resistive metal layer 39 and gold corrosion barrier film 36 thus provide a mutually protective structure. The gold corrosion barrier film 36 together with Nb$_2$O$_5$ (E) passivating rings 37–38 provide a seal to prevent corrosive contact between titanium and niobium; at the same time titanium resistive metal layer 39 encapsulates the surface and edge of gold corrosion barrier film 36 to prevent diffusion problems. Resistor trimming is accomplished by a selective addition of lead-gold-indium solder shunt 40 which overlies the titanium but cannot diffuse through the titanium to cause diffusion problems with gold corrosion barrier film 36.

Figure 6:
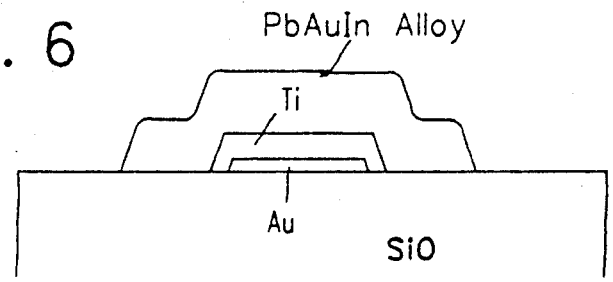
FIG. 6 is an end (elevation) view of a cross-section of the resistor shown in FIG. 3.

FIG. 6 illustrates the encapsulating of the mutually protective corrosion barrier film 36 and the resistive metal layer 39 on silicon dioxide substrate 36.

Lead-gold-indium solder 40 of the resistor trimming shunt is prevented by titanium resistive metal layer as a diffusion barrier from making contact with gold corrosion barrier film 36.

Note that in the preferred embodiment the resistor is appropriate for superconductive use. Niobium layer 34 is superconductive at liquid helium temperatures while the gold titanium resistor 36/39 is resistive. Lead-gold-indium solder 40 is superconducting and forms a zero resistance shunt to a portion of the resistive length of titanium resistive metal structure 39.

FIG. 5 shows the resistive relationships. The resistances of niobium metal areas 34 and 35 and of lead-gold-indium solder area 40 are each 0Ω at superconducting temperatures. Rs of the lead-gold-indium solder resistor trim shunts a portion of R(Ti) so as to trim the resistor to the desired value. R$_C$(Au) 41–42 is the quite small contact resistance through the gold barrier film between niobium metal 34–35 and titanium resistance metal 39.

The very small resistances 41 and 42 of the short path directly through corrosion barrier film 36 of gold are negligible except that they are not superconductive. The shunt resistance R(Au) 43 of the gold corrosion barrier film in parallel to the resistance R(Ti) of the titanium resistive metal film 39 is not negligible and forms a part of the overall resistance value of the gold titanium resistor.

FIG. 5 thus shows a gold titanium resistive connection between two superconductors 34 and 35 shunted by the resistance R(Au) 43 of the gold corrosion barrier film and the resistance R(Ti) 39 of titanium resistance layer. This Au/Ti composite resistor is partially shunted along a portion of its length by the zero resistance Rs (PbAuIn) of the superconducting trimming solder 40.

The technique of this patent specification thus provides in a preferred embodiment a minimum corrosion, trimmable diffusion resistant resistor structure with all process steps being self-aligned by the use of a single opening in a photoresist.

What is claimed is:

1. A contact structure for use with an intrinsically oxidizable conductive-metal layer in an integrated circuit characterized by
   (a) an oxide-free area of oxidizable conductive metal made free of intrinsic conductive metal oxide;
   (b) a corrosion barrier film forming a contact area film on said oxide-free area of the oxidizable conductive metal layer, having an exposed surface and edge, centrally located within said oxide-free area, and not fully covering said oxide free area;
   (c) a passivating ring of extrinsic metal oxide grown on the remaining oxide-free area surface of the oxidizable conductive metal layer about the periphery of said corrosion barrier film, extending to the edge of the oxide-free area; and
   (d) a resistive metal layer covering the exposed surface and edge of said corrosion barrier contact film.

2. A contact structure according to claim 1, wherein said corrosion barrier contact film is gold and said resistive metal layer is titanium.

3. A contact structure according to claim 1, wherein said conductive metal layer is niobium.

4. A contact according to claim 1 further characterized in that
   said resistive metal layer covers not only said corrosion barrier film area but extends over a part of said passivating ring of extrinsic conductive metal oxide.

5. A contact structure according to claim 4, wherein said conductive metal layer is niobium, said corrosion barrier film is selected from the group consisting of
   gold,
   platinum, and
   palladium, and said resistive metal layer is selected from the group consisting of
   molybdenum,
   hafnium,
   zirconium,
   vanadium,
   tantalum,
   tungsten, and
   ruthenium.

6. A contact structure according to claim 5 further characterized in that
   said gold barrier film is of thickness range 20 Å–200 Å; said titanium resistive metal layer is of thickness range 200 Å–2000 Å; and
   said passivating ring is Nb$_2$O$_5$ of thickness range 10 Å–200 Å.

* * * * *